Oct. 29, 1968 S. TESZNER 3,408,544

JUNCTION AND FIELD-EFFECT COMBINED TRANSISTOR

Filed Nov. 22, 1965 2 Sheets-Sheet 1

INVENTOR
STANISLAS TESZNER
BY
Abraham A. Saffitz
ATTORNEY

INVENTOR
STANISLAS TESZNER
BY
Abraham A. Saffitz
ATTORNEY

United States Patent Office 3,408,544

Patented Oct. 29, 1968

3,408,544

JUNCTION AND FIELD-EFFECT COMBINED TRANSISTOR

Stanislas Teszner, 49 Rue de la Tour, Paris, France

Filed Nov. 22, 1965, Ser. No. 509,007
Claims priority, application France, Nov. 23, 1964, 996,017
6 Claims. (Cl. 317—235)

ABSTRACT OF THE DISCLOSURE

A junction and field-effect combined transistor comprising a semiconductor wafer of a given type of conductivity, a first surface layer of the same type of conductivity of substantially constant thickness constituting the emitter and the source electrode, a second surface layer of said same type of conductivity constituting the collector and the drain electrode, the second surface layer having inner frustum-shaped projections, the terminal base of the frustums being closed to the first surface layer and being separated by small gap regions of the opposite type of conductivity, an intermediate layer of said opposite type of conductivity comprised between said first and second surface layers which is integral with said gap regions and forms at the same time the base and the gate electrode. The gap regions are substantially thinner than the gate regions at the gate electrode. Positive or negative bias can be applied to the base and gate electrode with respect to the emitter and source electrode and, according to the polarity of the bias, the combined transistor behaves as a junction transistor or as a field-effect transistor.

The present invention relates to semi-conductor devices having two possible modes of operation, which hereinbelow will be called "bivalent."

It is well known that junction transistors operate by injection of minority carriers, thus producing a current amplification effect. They are characterized particularly by a relatively high transconductance, a relatively low input impedance, and a remarkably low resistance at injection saturation.

Semi-conductor devices are also known which operate by modulation of conductance, in principle without the intervention of minority carriers, by means of field-effect which gives rise to voltage amplification. These devices are particularly characterized by a high input impedance and also by a high resistance in the blocked state, but also generally by relatively low transconductance per unit of surface.

It would frequently be advantageous to have available a semi-conductor device which, depending on circumstances and more particularly on its bias voltage, would have either the characteristics of a junction transistor or those of a field-effect transistor. It would thus be possible for the advantageous characteristics of either class of device to be successively operated at discretion; this would for example make it possible to obtain in switching applications particularly high ratios between resistance in the blocked state and resistance in the passing state.

The object of the present invention is to provide a bivalent semi-conductor device of this type.

The semi-conductor device according to the invention comprises at one and the same time the structures of a junction transistor, that is to say an emitter, a base, and a collector, and of a field-effect device, that is to say a source, a gate and a drain, the elements of these structures respectively merging entirely or partly with one another.

Moreover, the field-effect structure differs from conventional structures in that the conducting channel is interrupted on the source side by a thin layer of semiconductor of a type of conductivity opposite that of the channel and which forms the base of the junction transistor. Furthermore, this base is extended so as to enclose the channel completely or partly, thus forming the gate of the field-effect device. Finally, the transversal dimension of the channel, determining the channel pinch-off voltage by field-effect, increases from the source towards the drain, or possibly from the drain towards the source.

The invention also relates to methods of producing this bivalent semiconductor structure.

The invention will be better understood and its advantages will be made clear by the detailed description which will now be given and which will refer to the accompanying drawings, in which.

Figure 1:
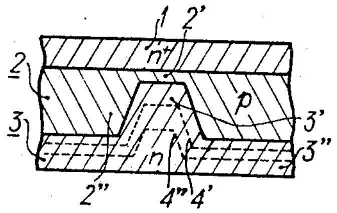
FIGURE 1 is a diagrammatical view in section of the elementary structure of the bivalent semiconductor device, showing its evolution under the effect of negative going bias of the gate-channel diode.

The structure illustrated in FIGURE 1 comprises, in a wafer of a semiconductor material, the following three parts:

A layer 1 of heavily doped semiconductor, for example of $N^+$ type, forming the emitter of the junction transistor and the source, here the cathode, of the field-effect device; the adjacent part 2 of P type, comprising a wide portion 2″ and a narrowed portion 2′, the portion 2′ forming the base of the junction transistor and the portion 2″ the gate of the field-effect device; finally, the part 3 of N type forming the collector of the junction transistor, its wedge 3′, which projects into the part 2, and the layer 3″ constituting respectively the conducting channel beneath the gate and the drain, here the anode, of the field-effect device. The semiconductor substance will preferably be silicon in the present state of the art, but it could possibly also be germanium or else intermetallic compound of Groups III and V of the periodic classification, such as gallium arsenide.

FIGURE 1 illustrates the evolution of the structure under the effect of a backward bias of the junction between the gate 2″ and the channel 3′. This evolution consists of a development of space charges on each side of the separation surface of the junction refered to above, but mainly in the channel 3′ having lower carrier density than the gate 2″ and the base 2′. The lines 4′ and 4″ represent by way of indication two stages of this development of space charges in the channel, a development which results in both the thickening of the base and the reduction of thickness of the channel. Said thickening results from the field-effect simultaneously along the axis of the channel and perpendicularly to said axis, and the reduction of thickness results solely from the last-mentioned effect.

In order to give some idea of an example of geometrical shape of the channel section, it will be assumed below that the section of the channel is circular, it being clearly understood that other geometrical shapes, for example square or rectangular sections, may also be used.

Figure 2:
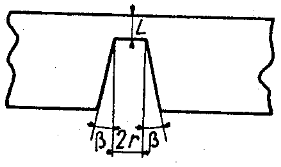
FIGURE 2 is a sketch explaining the determination of the conditions of this evolution.

Together with FIGURE 1, FIGURE 2 permits a brief discussion of the mechanism of development of space charges and its repercussion on the anode current and the corresponding transconductance. L here indicates the original thickness of the base (thickness at zero bias) which is intended to be invaded by the space charge; 2$r$ indicates the diameter at the top of the channel; $\beta$ indicates the angle of widening of frustum 3'. It should be observed that as long as 2$r$ and also the angle $\beta$ are sufficiently small, the transversal field-effect (radial field-effect in the case of the geometry considered) will be preponderant over the axial field-effect. As a first approximation therefore only this radial effect needs to be considered.

The current through the break 2' in the channel will here result from the emission of carriers from source 1, and they will pass through part 2' by the mechanism of conduction in the insulators, in which the current is limited by the space charges. Once again as a first approximation, the density of this current may be expressed in the following manner:

$$I_a = \frac{(\alpha k)V_a^n}{L^m} \qquad (1)$$

where $V_a$ is the voltage between the drain and the source, $(\alpha k)$ is a constant depending on the characteristics of the semiconductor material, and $m$ and $n$ are coefficients greater than or equal to unity. The current $I_a$ is reduced proportionally to the number of carrier traps contained in the insulator; as a result, $\alpha \ll 1$. The coefficient $\alpha$ becomes relatively considerable only when the electric field through the base becomes sufficient to neutralise the effect of these traps, for example by their ionization or any other mechanism. In this important region of the volt-ampere curve, starting from a voltage $V_{a0}$, it will be possible to write, with sufficient approximation for the physical reasoning which follows: $n \approx 2$; $m \approx 3$; $\alpha \approx 1$. Therefore:

$$I_a \approx \frac{k(V_a - V_{a0})^2}{L^3} \qquad (2)$$

This being so, for a given voltage $V_a$ the variation of the current $I_a$ will result from the development of the space charge resulting in the variation of the thickness L under the effect of backward bias $V_g$ of the gate-channel junction. In contrast to the conventional field-effect which modulates the conductance by variation of the channel section, it will be observed that the field-effect peculiar to the device according to the invention acts principally by variation of the thickness of the channel break.

The variation of L as a function of the bias voltage $V_g$ applied between the gate and the channel will now be computed by restricting ourselves as indicated above, solely to the radial effect on the channel $V_g$. It is possible to write, still as a first approximation, that starting from a voltage $V_{g0}$ sufficient to produce centripetal pinch-off at the apex of the channel, the variation $\Delta L$ in dependence on the variation $\Delta V_g$ will be given by the following expression:

$$\Delta L = \frac{a \Delta V_g}{2rtg\beta} \qquad (3)$$

where $$a = \frac{\rho_0}{4\epsilon_0 \epsilon_r}$$

(in rationalized Giorgi units). $\rho_0$ being the charge density, $\epsilon_0$ the permittivity of vacuum, and $\epsilon_r$ the permittivity of the semiconductor material used.

From this the following approximate expression is deduced:

$$\Delta I_a = \frac{3ka(V_a - V_{a0})^2}{2L^4 rgt\beta} \cdot \Delta Vg \qquad (4)$$

and finally:

$$s(\text{transconductance}) = \frac{3ka(V_a - V_{a0})^2}{2L^4 rtg\beta} \qquad (5)$$

The gap thickness L is very small and, as shown in FIG. 1, is substantially smaller than the height of projection 3'.

A brief discussion of the expression (5), which is necessary for good understanding of the further description given below, shows that for a given $V_a$ and for a given L it will be advantageous to reduce both $r$ and $tg\beta$ in order to increase transconductance. This will moreover be understood by intuition, because the reduction or $r$ entails a reduction of the complete striction voltage $V_{g0}$ at the apex of the channel, and the reduction of $tg\beta$ increases $\Delta L$ and therefore $\Delta I_a$ for a given variation $\Delta V_g$. These two effects together provide greater transconductance per unit of surface of the channel.

However, the reduction of the radius $r$ also results in a proportional reduction of the current passage section and therefore of the absolute value of the transconductance. In order to increase the latter it is necessary to utilize a plural structure similar to that described in U.S. Patent No. 2,930,950 issued Mar. 29, 1960.

Moreover, while still endeavouring as far as possible to keep $\beta$ low, care must be taken not to cancel it. With $\beta$ equal to 0, the channel will in fact be immediately blocked over the entire length as soon as the striction voltage $V_{g0}$ is reached; there will therefore be no progressive variation of $\Delta L$. On the other hand, it might be possible to permit $\beta$ to be negative, which would be equivalent to first closing the channel at the anode, and therefore instead of continuously increasing the thickness L of the first break invaded by the space charge, to add a second break in series, separated by an incompletely blocked channel portion. This possibility will be borne in mind, but hereinbelow only the case of a positive $\beta$ will be considered.

Figure 3:
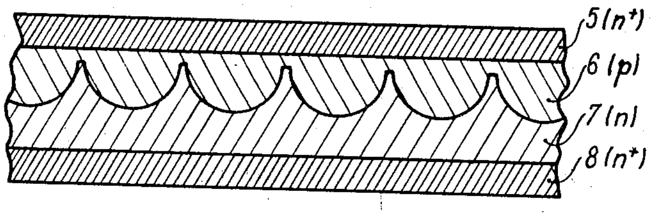
FIGURE 3 is a cross-sectional view of the embodiment of the invention as a plural structure.

FIGURE 3 illustrates a plural bivalent structure according to the invention. The layer 5 forming the emitter of the junction transistor and the source of the field-effect device is of a semiconductor material of N type, with $N^+$ heavy doping. The intercalated layer 6 forming respectively the base and gate is of P type; the intercalated layer 7 forming respectively the collector, channel and drain is of N type. Finally, the layer 8 forming the collector and drain contact is of N type with $N^+$ heavy doping. We recognize here the association in parallel of the elementary structures already described in connection with FIGURE 1, with the addition of the collector-drain contact layer 8. In addition, the reduction to the minimum of the initial diameter of the channel at the apex and also an attenuation of its divergence over part of its length will be observed. This is in conformity with the conclusions of the discussion of Formula 5.

This elementary or plural structure may be obtained by successive diffusions of the N type (for example phosphorus) and of the P type (for example boron) in accordance with the process already described for example in U.S. Patent No. 3,274,461 issued Sept. 20, 1966. The principal stages thereof will be briefly recalled.

Figure 4:
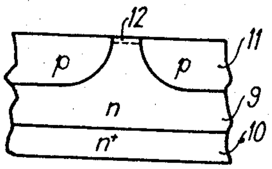
FIGURES 4 to 7 are sketches explaining two methods of manufacture of said structure.
Figure 5:
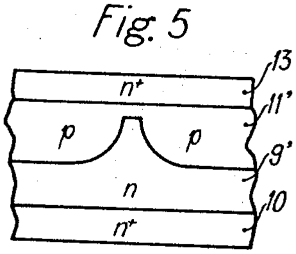

FIGS. 4 and 5 illustrate two phases of this production, only an elementary cell being shown. In a wafer of semiconductor material of N-type conductivity, of which finally only the portion 9 remains unaltered, the $N^+$ layer 10 is first formed by diffusion, then through an oxide mask suitably apertured by the photolithographic process on the opposite face, an impurity P is diffused, thus forming the gate 11. This having been done, the layer of oxide is dissolved on this face and the P-type conductivity determining impurity is again diffused, but for a short period of time which is just sufficient to cut the apex of the channels, as shown by the broken line 12. This having been done, the operation is terminated, as illustrated in FIG. 5, by diffusion through the same surface, after previous cleaning, of a N-type conductivity determining impurity of high concentration (because of predeposition) and therefore of the N+ type, which will, at least partly, push back the layer of P-type impurity in front of it. A final structure is thus obtained in which the intercalated layers 9 and 11 previously mentioned become respectively layers 9' and 11'.

Figure 6:
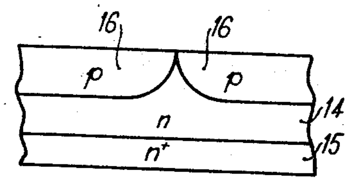
Figure 7:
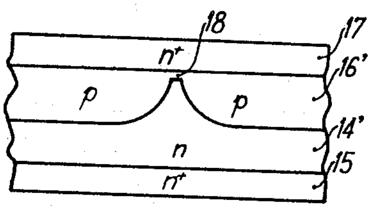

FIGS. 6 and 7 illustrate two phases of production according to an alternative form of this process, in which the procedure is as follows:

After diffusion as described above of a N+ layer 15 into a wafer of N-type conductivity semiconductor material (here bearing the reference 14), a P-type conductivity determining impurity forming the gate 16 will be diffused through an oxide mask apertured as previously. This diffusion will however here be continued until the side faces of the diffused portions meet as illustrated in FIG. 6. After this and after removal of the oxide layer, the high concentration N-type impurity will be diffused. This N+ diffusion pushes back in front of it the side flanks of the P-type diffused gate and will form a structure of the type illustrated in FIG. 7, where the N+ layer bears the reference 17 and the intercalated layers 14 and 16 become 14' and 16'. It will be observed that a channel is here obtained which has a very small diameter at the apex, as well as a small angle $\beta$. Finally a slight thickness L of the original break of the channel 18 is here also obtained. All the conditions necessary for obtaining high transconductance during the operation of the field-effect device are thus here fulfilled. It should moreover be indicated that the slight thickness of the base 18 will make it possible to obtain a high current gain during operation as a junction transistor. On the other hand this modified production process is more delicate to carry out than the process described previously.

Figure 8:
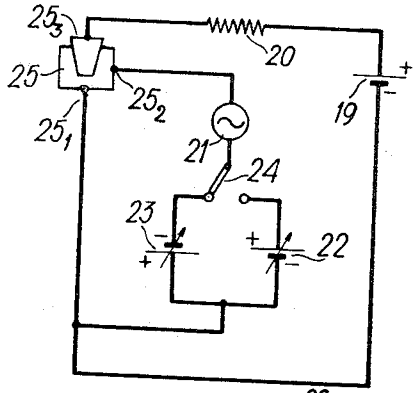
FIGURE 8 is a diagram of a circuit using the bivalent semiconductor device, said circuit being reduced to its simplest expression.

FIG. 8 shows the diagram, reduced to its simplest expression, of a switching circuit utilizing the bivalent device formed from a N-type semiconductor material. In this diagram 19 represents the supply current source, 20 the load and 21 the source of signals to be gated and amplified or blocked; 22 and 23 indicate the gate bias sources the voltage of which can be varied as required, for operating as a N-P-N junction transistor (positive going bias) or as a field-effect transistor (negative going bias) respectively; the switch 24 permits changing over from one form of operation to the other; finally, the bivalent device is illustrated diagrammatically at 25 with emitter-source $\mathbf{25_1}$, base-gate $\mathbf{25_2}$ and collector-drain $\mathbf{25_3}$. The switching circuit 25 is passing when switch 24 is on the side of bias source 22 and it is blocked when switch 24 is on the side of bias source 23.

Figure 9:
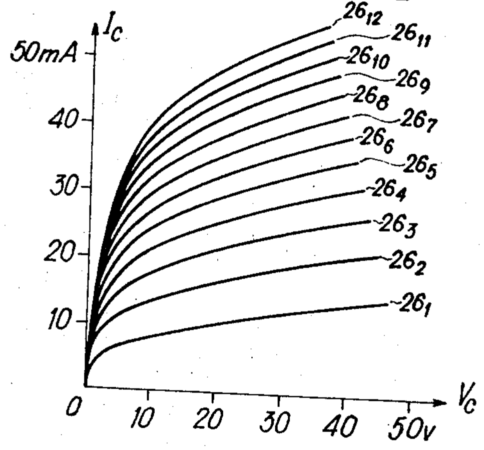
FIGURES 9 and 10 show families of static characteristics of the device operating respectively as a junction transistor and as a field-effect device.
Figure 10:
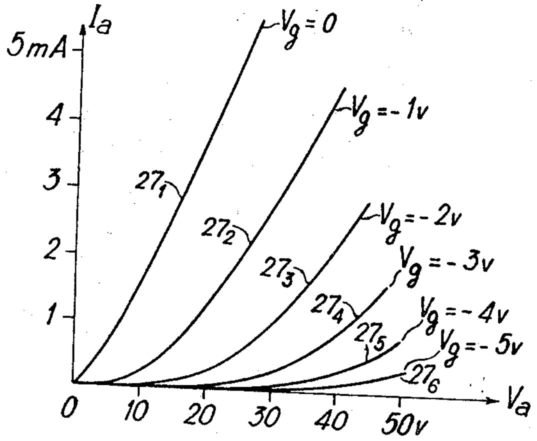

FIGS. 9 and 10 show families of static characteristics, for operation as a junction transistor (emitter-collector) and field-effect device (source-drain) respectively, plotted with an experimental bivalent device with the circuit illustrated in FIG. 8 but without signal source, that is to say by simple variation of the gate bias. The curves $\mathbf{26_1}$ to $\mathbf{26_{12}}$ in FIG. 9 represent the successive steps of the collector current obtained by injection at the base of a current increasing by steps of 0.05 ma., thus giving a current gain exceeding 100, which is considerable, particularly as this gain is obtained for relatively low collector currents. The curves $\mathbf{27_1}$ to $\mathbf{27_6}$ correspond to the variation of the drain current of the field-effect device for gate bias ranging from 0 to −5 v. These are good triode characteristics with maximal transconductance exceeding 3 ma./v. and a voltage amplification factor $\mu$ close to 20.

The residual current in the blocked condition, which cannot be read in this figure, is here lower than 1 na., so that this device used as a switch alternately operating as a junction transistor in the passing state and as a field-effect device in the blocked state would obtain a ratio of the order of $10^8$ between the currents corresponding to these two states, which is quite remarkable.

The plural structure which gave these results comprised about one hundred channels in parallel and an active surface of the order of 0.1 square mm. It is understood that these results are given only as examples by way of simple indication, both from the quantitative and from the qualitative point of view.

It is also understood that the structure geometries and also the materials used may vary without the device thereby departing from the scope of the invention, provided that the general principles explained in the preamble are applied thereto.

What I claim is:

1. A junction and field-effect combined transistor comprising a semiconductor wafer of a given type of conductivity, a first surface layer of said type of conductivity of substantially constant thickness forming at the same time the emitter and the source electrode of the combined transistor, a second surface layer of said type of conductivity forming at the same time the collector and the drain electrode of the combined transistor and having inner frustum-shaped projections, an intermediate layer of the opposite type of conductivity comprised between said first and second surface layers, forming at the same time the base and the gate electrode of the combined transistor, the ends of said projections being separated from the first surface layer by gaps substantially smaller than the height of the projections, and means for selectively applying positive and negative bias to said base and gate electrode with respect to said emitter and source electrode, whereby said combined transistor behaves as a junction transistor for a bias of a given polarity and as a field-effect transistor for a bias of opposite polarity.

2. A junction and field-effect combined transistor comprising a semiconductor wafer of a given type of conductivity, a first surface layer of said type of conductivity of substantially constant thickness forming at the same time the emitter and the source electrode of the combined transistor, a second surface layer of said type of conductivity forming at the same time the collector and the drain electrode of the combined transistor and having inner projections in the form of frustums with the end surface thereof parallel to the inner surface of the first surface layer and separated therefrom by gaps substantially smaller than the height of the projections and an intermediate layer of the opposite type of conductivity comprised between said first and second surface layers, forming at the same time the base and the gate electrode of the combined transistor, and means for selectively applying positive and negative bias to said base and gate electrode with respect to said emitter and source electrode whereby said combined transistor behaves as a junction transistor for a bias of a given polarity and as a field-effect transistor for a bias of opposite polarity.

3. A junction and field-effect combined transistor comprising a semiconductor wafer of a given type of conductivity, a first surface layer of said type of conductivity of substantially constant thickness forming at the same time the emitter and the source electrode of the combined transistor, a second surface layer of said type of conductivity forming at the same time the collector and the drain electrode of the combined transistor and having inner projections in the form of tapering points with said points separated from the inner surface of the first surface layer by gaps substantially smaller than the height of the projections and an intermediate layer of the opposite type of conductivity comprises between said first and second surface layers, forming at the same time the base and the gate electrode of the combined transistor and means for selectively applying positive and negative bias to said base and gate electrode with respect to said emitter and source electrode, whereby said combined transistor behaves as a junction transistor for a bias of a given polarity and as a field-effect transistor for a bias of opposite polarity.

4. A junction and field-effect combined transistor comprising a semiconductor wafer of a given type of conductivity, a first surface layer of said type of conductivity which is of substantially constant thickness constituting the emitter and the source electrode of the combined transistor, a second surface layer of said same type of conductivity constituting the collector and the drain electrode of the combined transistor and having inner frustum-shaped projections, an intermediate layer of the opposite type of conductivity comprised between said first and second surface layers, forming at the same time the base and the gate electrode of the combined transistor, said intermediate layer having a given thickness in the regions comprised between said first and second layers and a substantially smaller thickness in the regions comprised between the first layer and the projections of the second layer, and means for selectively applying positive and negative bias to said base and gate electrode with respect to said emitter and source electrode, whereby said combined transistor behaves as a junction transistor for a bias of a given polarity and as a field-effect transistor for a bias of opposite polarity.

5. A junction and field-effect combined transistor as set forth in claim 4 in which the first surface layer, the second surface layer and the projections thereof are of N-type semiconductor material and the intermediate layer is of P-type semiconductor material, whereby said combined transistor behaves as a passing junction transistor when the bias of the base and gate electrode with respect to the emitter and source electrode is positive and as a blocked field-effect transistor when said bias is negative.

6. A junction and field-effect combined transistor as set forth in claim 4 in which the first surface layer, the second surface layer and the projections thereof are of P-type semiconductor material and the intermediate layer is of N-type semiconductor material, whereby said combined transistor behaves as a passing junction transistor when the bias of the base and gate electrode with respect to the emitter and source electrode is negative and as a blocked field-effect transistor when said bias is positive.

References Cited

UNITED STATES PATENTS

| | | | |
|---|---|---|---|
| 3,022,568 | 2/1962 | Nelson et al. | 29—25.3 |
| 3,210,225 | 10/1965 | Brixey | 148—187 |

JOHN W. HUCKERT, *Primary Examiner.*

R. SANDLER, *Assistant Examiner.*